(12) United States Patent
Jones et al.

(10) Patent No.: US 12,247,481 B2
(45) Date of Patent: Mar. 11, 2025

(54) DIGITALLY RECONFIGURABLE ANALOG COMPUTATIONS FOR SOLVING OPTIMIZATION PROBLEMS

(71) Applicant: Halliburton Energy Services, Inc., Houston, TX (US)

(72) Inventors: Christopher Michael Jones, Houston, TX (US); Xiang Wu, Singapore (SG); Imran Sharif Vehra, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 175 days.

(21) Appl. No.: 18/124,985

(22) Filed: Mar. 22, 2023

(65) Prior Publication Data

US 2024/0026779 A1 Jan. 25, 2024

Related U.S. Application Data

(60) Provisional application No. 63/391,466, filed on Jul. 22, 2022.

(51) Int. Cl.
*E21B 47/12* (2012.01)
*E21B 47/00* (2012.01)
(Continued)

(52) U.S. Cl.
CPC ............ *E21B 47/12* (2013.01); *E21B 47/00* (2013.01); *E21B 47/07* (2020.05); *H03M 1/089* (2013.01)

(58) Field of Classification Search
CPC .......... E21B 47/12; E21B 47/00; E21B 47/07; H03M 1/089
(Continued)

(56) References Cited

U.S. PATENT DOCUMENTS 10,563,501 B2 * 2/2020 Cooley ................ G01V 11/002
11,143,782 B2 * 10/2021 Zhou ....................... G01V 3/32
(Continued)

FOREIGN PATENT DOCUMENTS

EP 0201297 B1 3/1993
EP 3249154 A1 11/2017

OTHER PUBLICATIONS

Di Ventra, Massimiliano et al., "Perspective: Memcomputing: Leveraging memory and physics to compute efficiently", Journal of Applied Physics; Published May 10, 2018; https://doi.org/10.1063/1.5026506.
(Continued)

*Primary Examiner* — Khai M Nguyen
(74) *Attorney, Agent, or Firm* — NOVAK DRUCE CARROLL LLP

(57) ABSTRACT

Aspects of the subject technology relate to systems and methods for configuring links or switches that connect analog circuit elements. These analog circuit elements may be connected to a plurality of sensors that may sense different types of data. For example, these sensors may sense acoustic data, electromagnetic (EM) data, temperature, pressure, and possibly other metrics that may be located in a wellbore of an oil or gas well. These analog circuits may be configured as needed (e.g., on-the-fly) to perform optimized types of computations that may include the solving of differential equations. Examples of analog circuits that may be incorporated into a sensing system include yet are not limited to operational amplifier circuits or memcomputing devices, other components, or combinations thereof. Configured analog circuits may be coupled to digital electronics that perform other functions.

20 Claims, 10 Drawing Sheets

(51) Int. Cl.
*E21B 47/07* (2012.01)
*H03M 1/08* (2006.01)

(58) Field of Classification Search
USPC .......................................................... 341/126
See application file for complete search history.

(56) References Cited

U.S. PATENT DOCUMENTS

2002/0190718 A1  12/2002  Gard et al.
2008/0100978 A1   5/2008  Maebara et al.
2015/0142203 A1   5/2015  Roth et al.

OTHER PUBLICATIONS

Manukain, Haik et al., "Accelerating Deep Learning With Memcomputing", https://www.sciencedirect.com/science/article/pii/S0893608018302971; Jul. 2018.

Traversa, Fabio L. et al., "Evidence of Exponential Speed-Up in the Solution of Hard Optimization Problems" vol. 2018, Article ID 7982851, 13 pages; https://doi.org/10.1155/2018/7982851; Published Jul. 3, 2018.

Di Ventra, Massimiliano et al., "Digital Memcomputing: from Logic to Dynamics to Topology", Department of Physics, University of California San Diego; Mar. 18, 2019.

Traversa, Fabio L. et al., "Aircraft Loading Optimization: MemComputing the 5th Airbus Problem", Jun. 11, 2019.

Sheldon, Forrest et al., "Taming a non-convex landscape with dynamical long-range order: memcomputing Ising benchmarks", Department of Physics, University of California San Diego; Oct. 15, 2019.

Manukain, Halk et al., "Mode-Assisted Unsupervised Learning of Restricted Boltzmann Machines", Department of Physics, University of California San Diego; Jan. 19, 2020.

Bonnin, Michele et al., "Coupled oscillator networks for von Neumann and non von Neumann computing", Department of Electronics and Telecommunication; Politecnico di Torino, Apr. 24, 2019.

Zhang, Yuan-Hang et al., "Directed percolation and numerical stability of simulations of digital memcomputing machines", Department of Physics, University of California San Diego; Mar. 31, 2021.

Caravelli, F. et al., "Global minimization via classical tunneling assisted by collective force field formation", Theoretical Division (T4) and Center for Nonlinear Studies; Jan. 6, 2022.

Di Ventra, Massimiliano et al., "MemComputing vs. Quantum Computing: some analogies and major differences", Mar. 24, 2022.

International Search Report & Written Opinion; PCT Application No. PCT/US2023/016122; mailed Jul. 17, 2023.

* cited by examiner

DIGITALLY RECONFIGURABLE ANALOG COMPUTATIONS FOR SOLVING OPTIMIZATION PROBLEMS

CROSS-REFERENCE TO RELATED APPLICATIONS

This application claims priority to U.S. Provisional Patent Application No. 63/391,466, filed on Jul. 22, 2022, and entitled "DIGITALLY RECONFIGURABLE ANALOG COMPUTATIONS FOR SOLVING OPTIMIZATION PROBLEMS," the contents of which are hereby incorporated by reference in their entirety and for all purposes.

TECHNICAL FIELD

The present disclosure is generally directed to the processing of data sensed in a wellbore. More specifically, the present disclosure is directed to improving the processing of data that may be used to control tools located within the wellbore.

BACKGROUND

Sensors associated with the actions of drilling for oil and gas sense massive amounts of data that include acoustic data, electromagnetic data, temperature data, pressure data, electromagnetic data, as well as other types of data. Volumes of acoustic or electromagnetic (EM) data provide large challenges for those wishing to monitor and control well drilling operations. Environmental conditions, communication bandwidth limitations, limited processing power, and component sensitivity are associated with limiting amounts of data that can be used to operate and control equipment of a wellbore.

The amounts of data sensed in a wellbore are often simply too large for current processing systems to evaluate completely. One issue is associated with limited bandwidths associated with sending data from a wellbore to a computer located at the surface of a wellbore using conventional wireline telemetry or wireless communications. Conventional digital processing systems also have limited processing power for compute intensive tasks like solving a partial differential equation. This is especially true when processing tasks are performed down a wellbore. Performing operations associated with logging while drilling (LWD) using multipulsed telemetry also has limitations. While collected data may be compressed, such techniques provide other limitations, such as data loss and distortions in the data received by a computing device. Lost data and distortions further degrade capabilities of an analysis that is performed on the received data. In instances when computations or parts of computations are performed downhole, a limited amount of space in the wellbore environment mean that wellbore electronics are allocated a small volume of space into which they are designed to fit. EM interference, and electronic component temperature instability pose yet other issues.

BRIEF DESCRIPTION OF THE DRAWINGS

In order to describe the manner in which the features and advantages of this disclosure can be obtained, a more particular description is provided with reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1A:
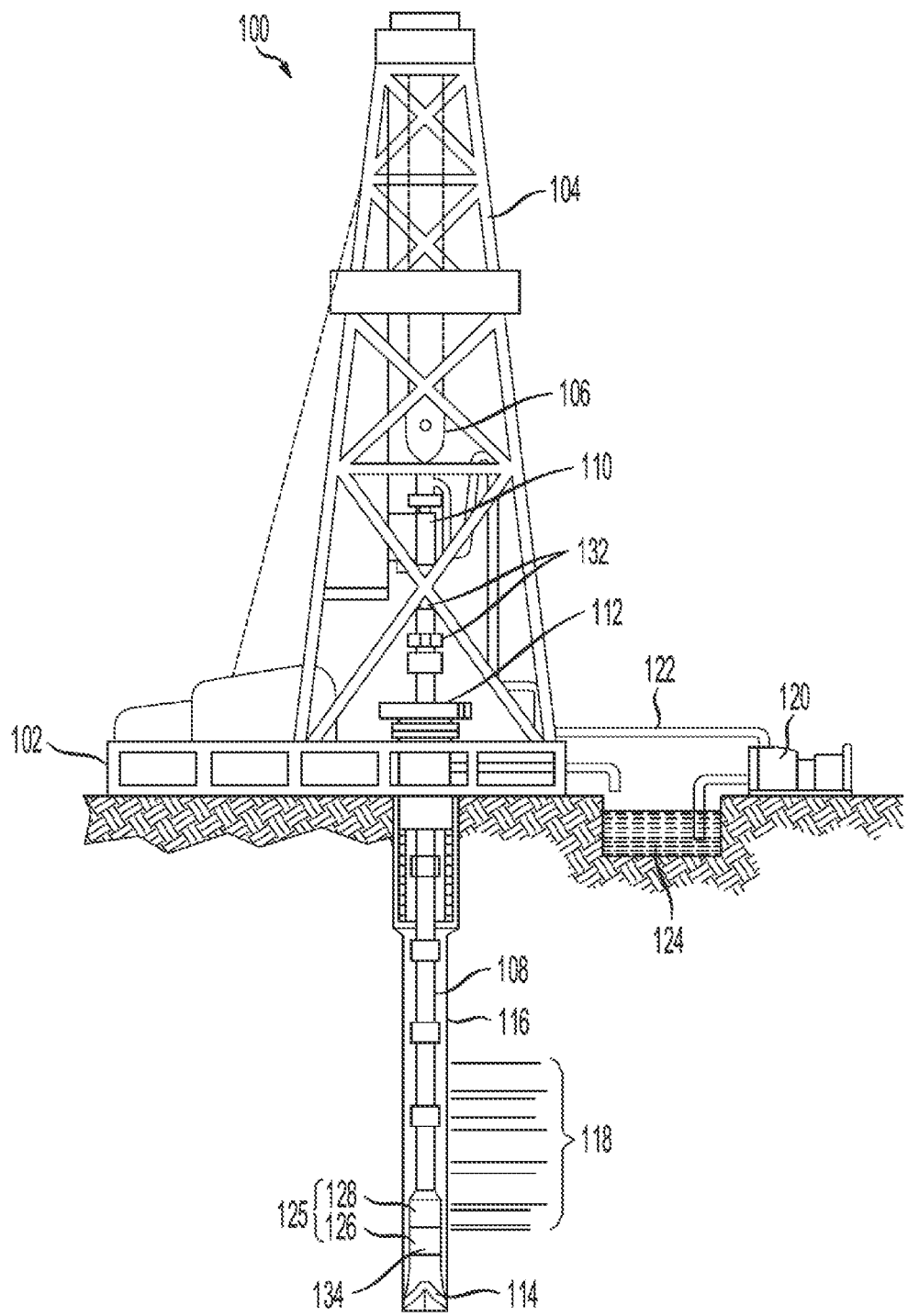
FIG. 1A is a schematic diagram of an example logging while drilling wellbore operating environment, in accordance with various aspects of the subject technology.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the principles disclosed herein. The features and advantages of the disclosure can be realized and obtained by means of the instruments and combinations particularly pointed out in the appended claims. These and other features of the disclosure will become more fully apparent from the following description and appended claims or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Limitations associated with computations performed in a wellbore may rely on approximations or partial signal feature extraction that can lead to distorted results and other artifacts. Examples of such computation approximations may include a one-dimensional (1D) approximation of a three-dimensional (3D) environment. Other examples of computational limitations are associated with acoustic signal feature extraction. Another limiting step in wellbore related computations is optimization. Also, it is not typically possible to implement finite element forward model inversion downhole. Various limitations (e.g., bandwidth, data compression loss, and noise) also mean that finite element forward model inversion may not be possibly at the top or surface level of a wellbore (e.g., up-hole) either.

Systems, methods, and apparatuses of the present disclosure may be used to identify conditions of a wellbore when tools used to make the wellbore are controlled. For example, wellbore conditions should be monitored such that instruments like a downhole electromagnetic imager, logging equipment associated with collecting data, or tools that manipulate a drill bit may be controlled according to a production schedule.

Systems, methods and apparatuses of the present disclosure may use configurable links that connect analog circuit elements. These analog circuit elements may be connected to a plurality of sensors that may sense different types of data. For example, these sensors may sense acoustic data, electromagnetic (EM) data, temperature, pressure, and/or other metrics that may be located in a wellbore of an oil or gas well. These analog circuits may be configured as needed (e.g., on-the-fly) to perform optimized types of computations that may include the solving of differential equations. Examples of analog circuits that may be incorporated into a sensing system include, but are not limited to, operational amplifier (op-amp) circuits, memristors, memcapacitors, meminductors, memcomputing machines, or combinations thereof.

Configurable links included in or attached to a set of analog circuitry or in an electronic chip may be similar to a connection fabric used in field programmable gate arrays. These configurable links may be implemented using electronic switches (e.g., crossbar switches) that may be a form of field effect transistor (FET), for example. In certain instances, a configurable link may be implemented using one or more memristors, where a low resistance (e.g., a few milliohms) may be used to connect two circuit elements and a high resistance (e.g., a few megohms) may be used to isolate the two different circuit elements.

Functions (e.g., amplification, integration, and summer) performed by particular op-amp devices may be controlled by connecting resistors and/or capacitors of specific values in specific configurations. Sets of op-amp devices connected in appropriate configurations may be used to perform processing tasks in the analog domain at speeds associated with effect of signals affecting the operation of transistors. Such computations are much faster than performing these computations in the digital domain. This is because analog circuits can perform complex computations virtually instantaneously (e.g., at hardware device speeds), where digital circuits must perform many processing steps to perform an approximation of a complex computation. Configured analog circuits may be coupled to digital electronics that perform other functions.

Values of resistors and capacitors may be controlled in various ways, for example by incorporating resistors of different values in the die of an integrated circuit. Capacitance may be controlled by including controlling trace and separation distances of features of an integrated circuit. The values of various resistors or capacitors temporarily included in a particular circuit may be controlled by connecting specific resistors or capacitors in serial or parallel configurations. Alternatively, or additionally, values of components may be set using memristors, memcapacitors, or meminductors. Memristors are devices that have resistances that can be changed based on applying voltage or currents to the memristor. Memcapacitors and meminductors have been developed based on principals associated with memristor technology. Once set, the set value of a component may be retained until that value is reset or reprogrammed. Any particular circuit configuration may include or use a subset of components that are available to be used.

Op-amp circuits may be used to amplify a signal (e.g., with an inverting amplifier circuit configuration), perform an integration (with an integrator circuit configuration), and to perform summing operations (with a summing circuit configuration). Memristors may be configured in arrays that allow certain equations to be performed using matrix mathematical operations. For example, memristor configurations may be used to perform functions associated with solving differential equations using matrix mathematical operations.

Methods, systems, and apparatuses of the present disclosure solves optimization problems in a circuit network. Analog circuits also have the advantage of performing evaluations in parallel. This may allow configurations of cell packets and finite simulation techniques to be mimicked. Interconnected circuits, not unlike memory circuits including but not limited to capacitive or resistive memory circuits, may be set with a change in state. The change in state can be partial changes in resistance or capacitance (e.g., in ways that partially increase resistivity or capacitance of specific elements). Additionally, interconnected circuits may include binary elements.

Memcomputing machines that perform computations may include sets of self-organizing logic gates (SOLCs). Self-organizing gates are logical gates capable of performing logical functions in either a conventional way (for example where the function an OR gate associated with two inputs produces an output) and in a reverse way, where setting the value of an output results in input states of the OR gate being driven into a result of an inverse function. The term input-output agnostic is used to describe this dual mode operation of memcomputing SOLCs. The conventional OR gate provides an output of a logical 0 only when all of its inputs have a value of 0. This conventional OR gate also provides an output of a logical 1 when any of its inputs have a value of 1. In reverse operation, when a 0 state is provided to the "output" of this SOLC OR gate, all inputs will be driven to the 0 state. The reverse operation of this SOLC OR gate when the "output" is driven to the 1 state has several possible solutions. In an instance when this SOLC OR gate has two inputs and the output is driven to a 1 state, possible input states for each respective input can include (0, 1), (1,0), and (1, 1).

Configurations may be set based on the receipt of binary indicators used to program the state of configurable links. A series configuration of circuits may provide a way to change connections on the fly (e.g., dynamically, on-demand). The circuits may be arranged into networks configurable in at least a partial digital fashion to mimic the structure of an optimization problem to be solved. In an analog fashion, the circuit may be activated at least along one point of the circuit and inputs may receive signals from sensors. Outputs may correspond to an analog function associated with signals attached to one or more inputs of a circuit configuration. The use of such analog circuits may result in a voltage, current, oscillations therein, frequency of oscillations, or other electrodynamic property being observed. The activation of a state may be AC or DC. Many physical phenomena can be mimicked by circuit configurations. The solution to such circuit simulations is inherently fast when analog hardware is used.

Since circuits of the present disclosure can be reconfigured on the fly (e.g., dynamically, on-demand), where a same circuit platform can simulate or perform multiple different types of phenomena analysis when an optimization is performed, for example reprogramming a set of circuits may allow engineers to change a differential equation when compensating for conditions at a wellbore. This technique also has the advantage that types of circuits that can work reliably at high temperature may be deployed in a downhole apparatus and/or environment. For example, analog circuits like operational amplifiers may be used to perform computations from data sensed by wellbore sensors. In certain instances, heat sensitive memory components or digital processors may be eliminated. Types of memory, combinatorial logic, and/or digital processors may be selected for their ability to operate in high temperature or in electrically noisy environments. In this manner, processing or pre-processing may take place downhole on directly measured signals. Resultant data may then be sent to the surface for additional processing, or as mentioned above, some processing may be performed in the digital domain using digital circuits suitable to the downhole environment.

Turning now to FIG. 1A, a drilling arrangement is shown that exemplifies a Logging While Drilling (commonly abbreviated as LWD) configuration in a wellbore drilling scenario 100. Logging-While-Drilling typically incorporates sensors that acquire formation data. Specifically, the drilling arrangement shown in FIG. 1A can be used to gather formation data through an electromagnetic imager tool as part of logging the wellbore using the electromagnetic imager tool. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids.

Logging tools 126 can be integrated into the bottom-hole assembly 125 near the drill bit 114. As the drill bit 114 extends into the wellbore 116 through the formations 118 and as the drill string 108 is pulled out of the wellbore 116, logging tools 126 collect measurements relating to various formation properties as well as the orientation of the tool and various other drilling conditions. The logging tool 126 can be applicable tools for collecting measurements in a drilling scenario, such as the electromagnetic imager tools described herein. Each of the logging tools 126 may include one or more tool components spaced apart from each other and communicatively coupled by one or more wires and/or other communication arrangement. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure.

The bottom-hole assembly 125 may also include a telemetry sub 128 to transfer measurement data to a surface receiver 132 and to receive commands from the surface. In at least some cases, the telemetry sub 128 communicates with a surface receiver 132 by wireless signal transmission e.g., using mud pulse telemetry, EM telemetry, or acoustic telemetry. In other cases, one or more of the logging tools 126 may communicate with a surface receiver 132 by a wire, such as wired drill pipe. In some instances, the telemetry sub 128 does not communicate with the surface, but rather stores logging data for later retrieval at the surface when the logging assembly is recovered. In at least some cases, one or more of the logging tools 126 may receive electrical power from a wire that extends to the surface, including wires extending through a wired drill pipe. In other cases, power is provided from one or more batteries or via power generated downhole.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. Because of the thickness of the collar's wall, pocket-type cutouts or other type recesses can be provided into the collar's wall without negatively impacting the integrity (strength, rigidity and the like) of the collar as a component of the drill string 108.

Figure 1B:
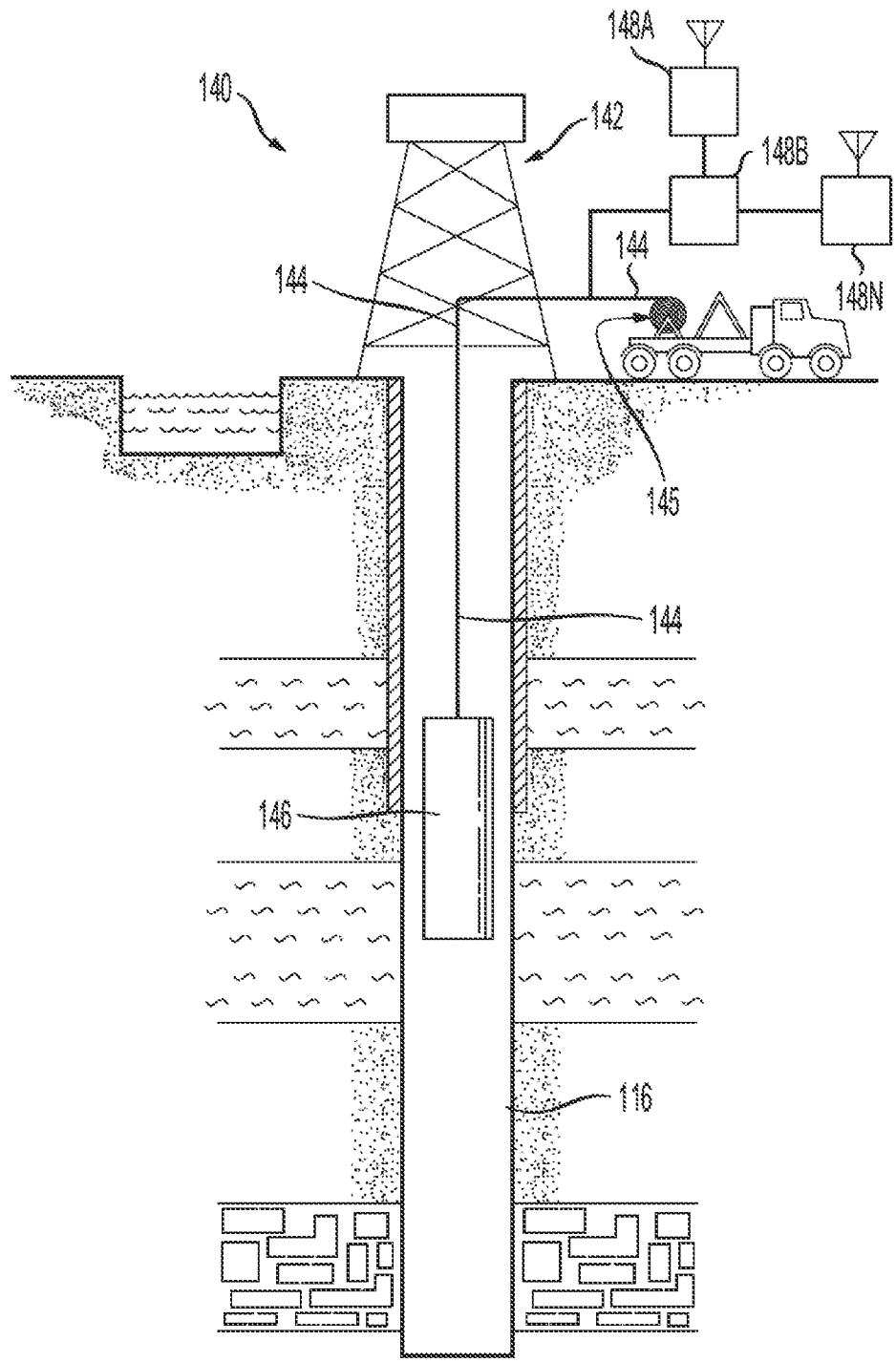
FIG. 1B is a schematic diagram of an example downhole environment having tubulars, in accordance with various aspects of the subject technology.

Referring to FIG. 1B, an example system 140 is depicted for conducting downhole measurements after at least a portion of a wellbore has been drilled and the drill string removed from the well. An electromagnetic imager tool can be operated in the example system 140 shown in FIG. 1B to log the wellbore. A downhole tool is shown having a tool body 146 in order to carry out logging and/or other operations. For example, instead of using the drill string 108 of FIG. 1A to lower the downhole tool, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars. The downhole tool can include an applicable tool for collecting measurements in a drilling scenario, such as the electromagnetic imager tools described herein.

The illustrated wireline conveyance 144 provides power and support for the tool, as well as enabling communication between data processors 148A-N on the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. The processors 148A-N can be integrated as part of an applicable computing system, such as the computing device architectures described herein. Moreover, power can be supplied via the wireline conveyance 144 to meet power requirements of the tool. For slickline or coiled tubing configurations, power can be supplied downhole with a battery or via a downhole generator.

Figure 2:
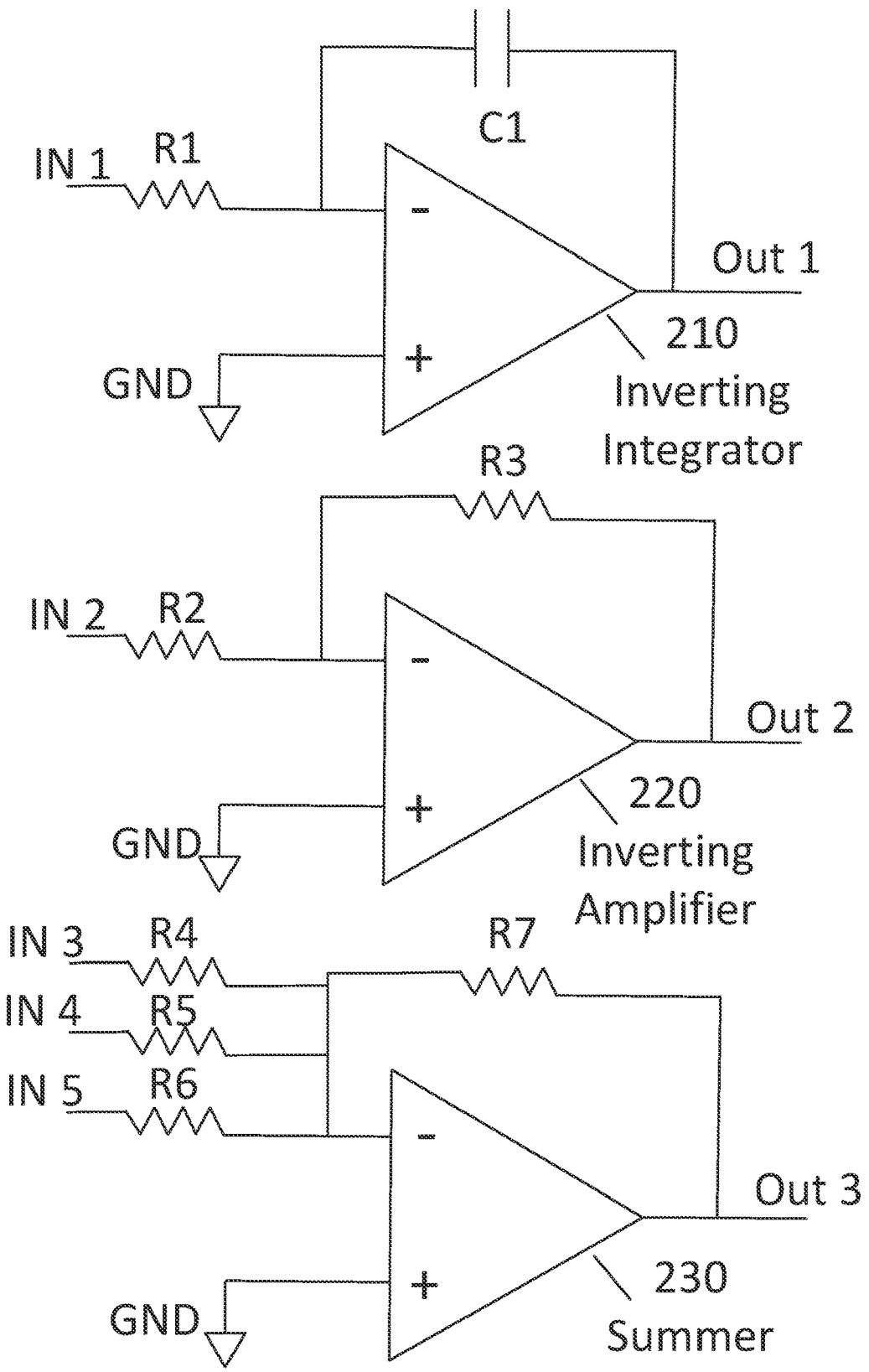
FIG. 2 illustrates three different operational amplifier circuits that may be used to perform functions of integration, amplification, and addition.

FIG. 2 illustrates three different operational amplifier circuits that may be used to perform functions of integration, amplification, and addition. FIG. 2 includes an inverting integrator circuit 210, an inverting amplification circuit 220, and an addition or summing circuit 230. Each of these circuits includes an operational amplifier with respective positive and negative inputs. Note that each of the positive inputs are connected to a ground (GND) and each of the negative inputs are connected to respective sets of components.

The negative input of the operational amplifier (op-amp) inverting integrator circuit 210 of FIG. 2 is connected to resistor R1 and capacitor C1. A signal input on input IN-1 of circuit 210 will be integrated based on the operation of the inverting integrator circuit 210. A signal located at output OUT-1 of circuit 210 is the inverted integration of the signal input on input IN-1 that correspond to values of R1 and C1.

The negative input of the operational amplifier (op-amp) summing circuit 220 of FIG. 2 is connected to resistors R2 and R3. A signal input on input IN-2 of circuit 220 will be inverted and amplified according to the ratio of the resistance of resistor R3 divided by the resistance of resistor R2 (R3/R2). A signal located at output OUT-2 of circuit 220 is the inverted amplification of the signal input on input IN-2 of circuit 220.

The negative input of the operational amplifier (op-amp) summing circuit 230 of FIG. 2 is connected to resistors R4, R5, R6, and R7. A signal input on input IN-3, IN-4, and IN-5 of circuit 230 will be inverted and summed according to the formula (A*R7/R4+B*R7/R5+C*R7/R6), where values of A, B, and C correspond to voltages respectively provided to IN-3, IN-4, and IN-5 of circuit 230.

Integration circuits, amplification circuits, and summing circuits like circuits 210, 220, and 230 of FIG. 2 may be combined to perform various mathematical functions that include differentiation, integration, multiplication, and/or addition.

Figure 3:
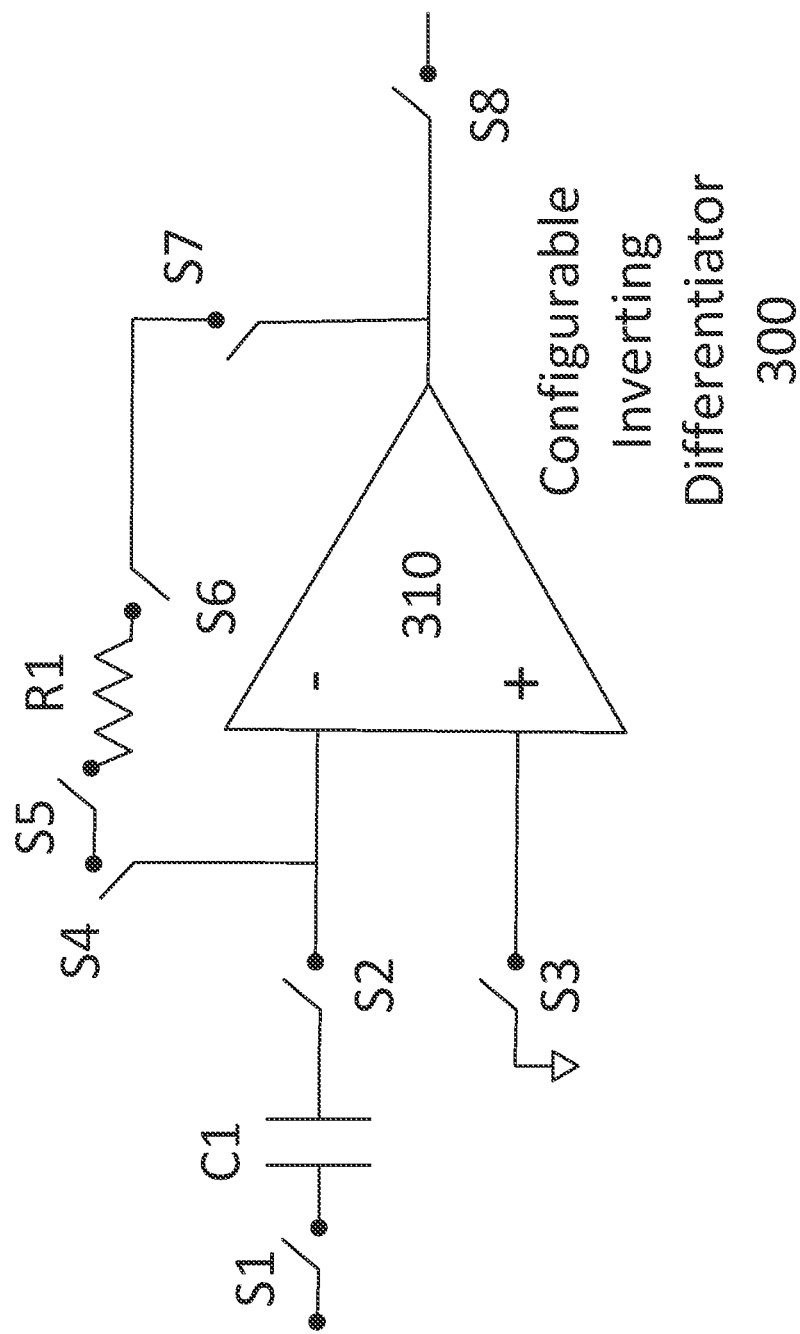
FIG. 3 illustrates that switches may be used to connect components such as resistors and capacitors to inputs or outputs of an operational amplifier.

FIG. 3 illustrates example switches used to connect components such as resistors and capacitors to inputs or outputs of an operational amplifier. FIG. 3 includes operational amplifier 310, resistor R1, capacitor C1, and switches S1 through S7 (i.e., SW1, SW2, SW3, SW4, SW5, SW6, AND SW7). Resistor R1, capacitor C1, and switches S1 through S7 may represent a few components of several arrays of resistors, capacitors, and switches that may all be included in an integrated circuit that may be programmed using tools similar to the Verilog or VHDL (very high-speed integrated circuits hardware description language) programming language. The circuit configuration illustrated in FIG. 3 when each of switches S1 through S7 are closed, operational amplifier 310 is configured to be an inverting differentiator circuit 300.

Figure 4:
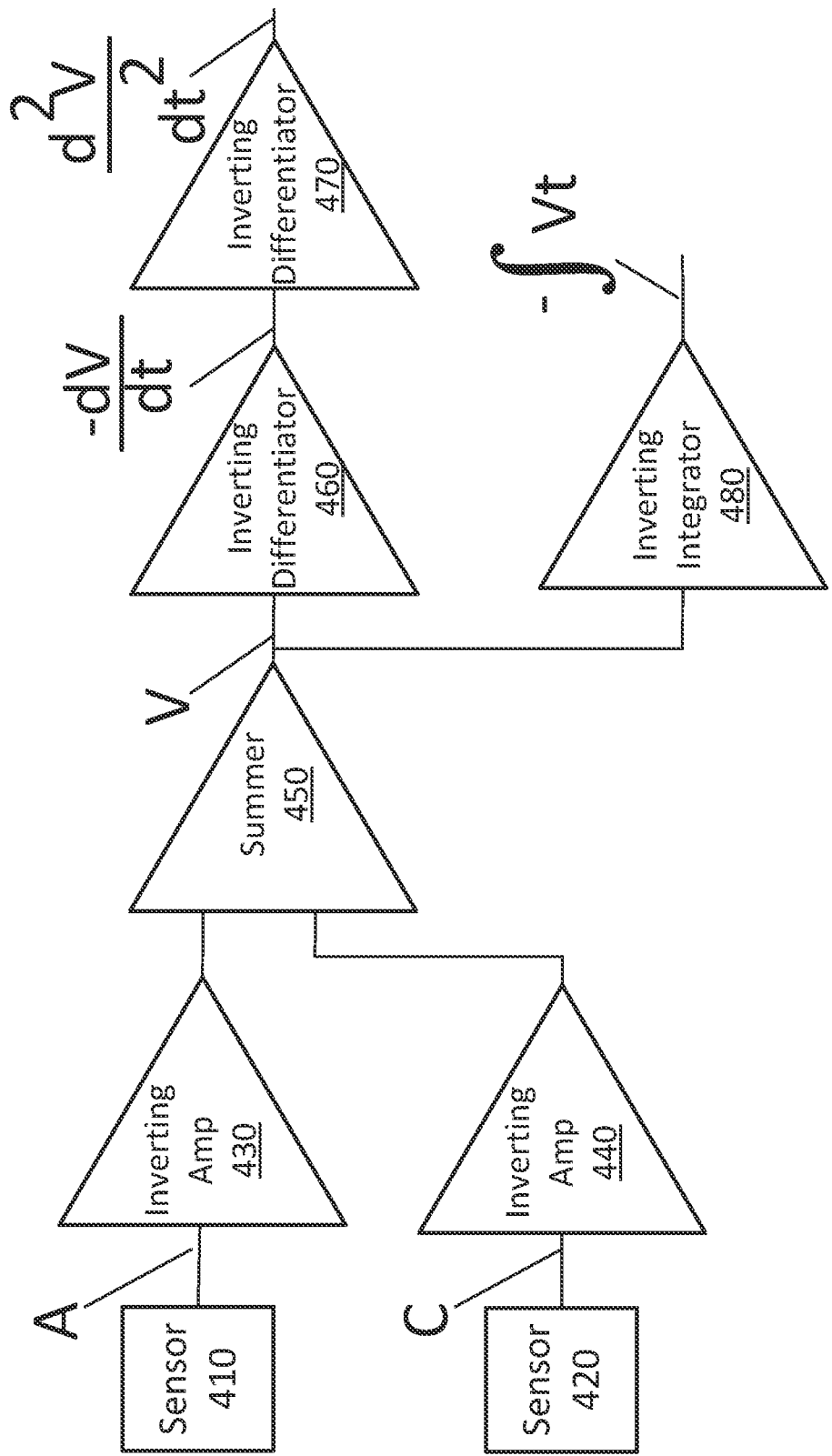
FIG. 4 illustrates a set of operational amplifier circuits arranged in a configuration that may have been connected using programmable links or switches as discussed above.

FIG. 4 illustrates a set of operational amplifier circuits arranged in a configuration that may have been connected using programmable links or switches as discussed above. To simplify FIG. 4, the resistors and capacitors and switches used to form these circuits are not shown, yet would be similar to the resistors, capacitors, and switches shown in and described in respect to FIG. 2 or FIG. 3.

FIG. 4 includes sensors 410 and 420 that respectively provide inputs A and C to inverting amplifier 430 and inverting amplifier 440. Outputs of inverting amplifiers 430 and 440 are provided to summer 450 that adds signals from inverting amplifier 430 and 440 such that voltage V may be provided to inverting differentiator 460 and inverting integrator 480. Note that the output of inverting differentiator 460 is provided to inverting differentiator 470.

Note that when inverting amplifiers 430 and 440 as well as summer 450 have gains of one, voltage V will equal the sum of signals A and C (V=A+C). Note also that the output of inverting differentiator 460 corresponds to the function −dV/dt, that the output of inverting differentiator 470 corresponds to the function $d^2V/dt^2$, and that the output of inverting integrator corresponds to the function $-\int Vt$. The circuit of FIGS. 2-4 illustrate that various mathematical functions may be configured on-the-fly using programmable links. As discussed with respect to FIG. 8, configurable components (e.g., memristors, memcapacitors, meminductors, or others) may be permanently connected to certain inputs and/or outputs of an analog circuit (such as an operational amplifier) and values of those components could be configured to have specific values whenever an operator of the system wishes. Links that connect various analog circuits may also be configured to form the combined circuit set illustrated in FIG. 4. Such links used to connect specific circuit elements may be implemented using field effect transistors (FETs), crossbar switches, other types of active/transistor switches, changing resistance values, or a combination thereof.

Note that by sampling values of voltage V, a value that corresponds to a sum of signals sensed by sensor 420 and sensor 420 may be identified without need of a digital processor. A formula that corresponds to the first derivative (dV/dt), the second derivative ($d^2V/dt^2$), or the integral ($\int Vt$) of voltages V over time may be identified without need of a digital processor.

Figure 5:
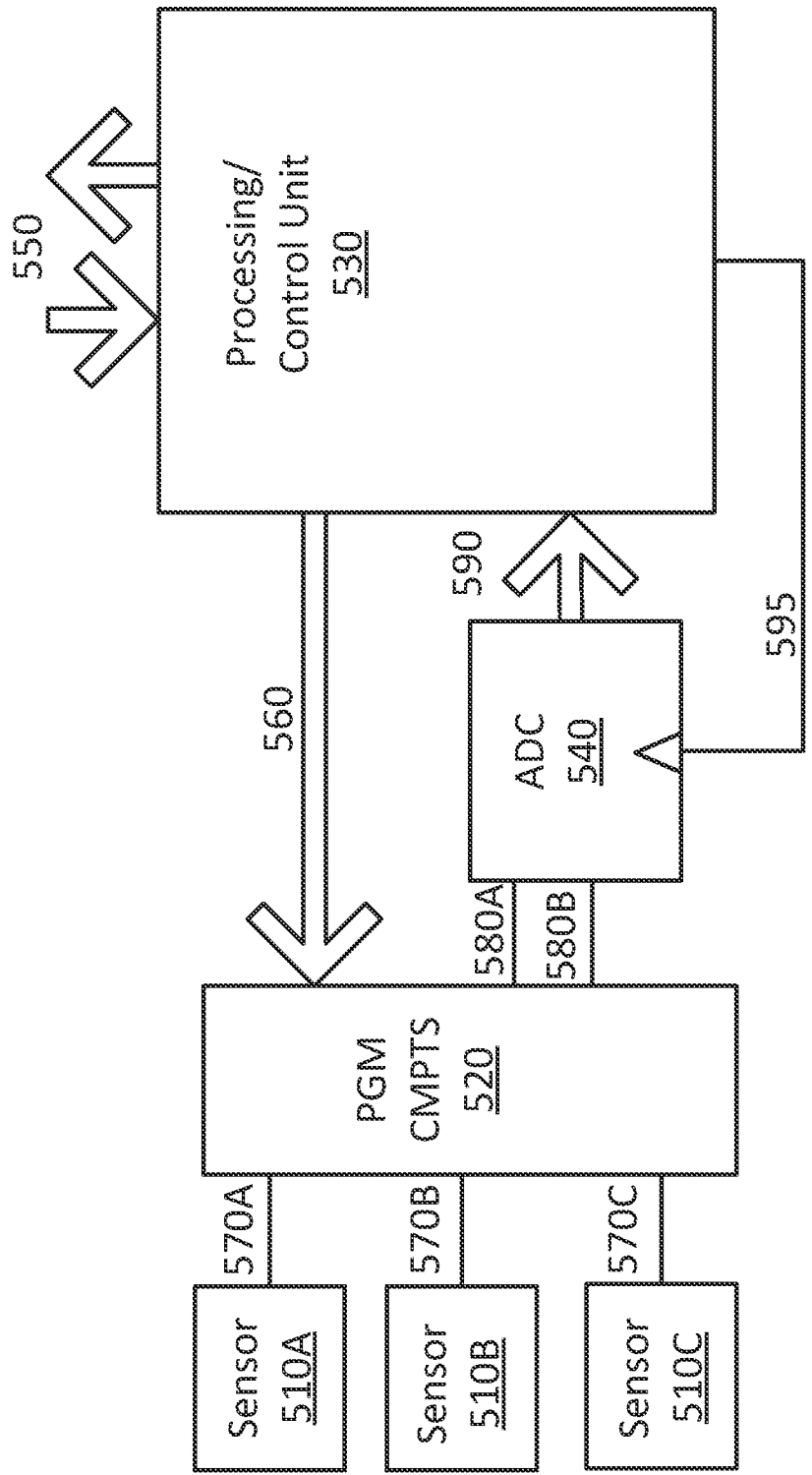
FIG. 5 illustrates sets of electronic components that may be included in or attached to a bottom hole assembly of a wellbore.

FIG. 5 illustrates sets of electronic components that may be included in or attached to a bottom hole assembly of a wellbore. FIG. 5 includes process/control unit 530, programmable components 520, sensors 510A, 510B, and 510C, and analog to digital converter (ADC) 540. Item 550 may be a single communication line or multiple communication lines that may receive data from and send data to a computer at the top of a wellbore. Data received from or sent to the computer at the top of the wellbore may be sent via a wire, a fiber optic line, or may be transmitted via a wireless signal. Item 560 may be a communication line or bus that sends data from the processing/control unit 530 to program components 520. Sensors 510A-510C may provide data to these programmed components 520 via respective communication lines 570A, 570B, and 570C.

As the set of programmed components 520 receives sensor data from sensors 510A-510C, components 520 perform a processing function and provide processed data to ADC 540 via signal lines 580A and 580B. In an instance when the set of programmed components 520 performs functions consistent with formula 1. Here, signal lines 580A and 580B may respectively provide to ADC 540 a first signal that corresponds to the second derivative of a voltage sensed by sensor 510A and a second signal that corresponds to the first derivative of the voltage sensed by the sensor 510A, for example. Signal line 595 may be a clock sent from the processing control unit 530 that controls when ADC 540 samples the signals provided to ADC 540 via signal lines 580A and 580B. Sampled data may then be provided from ADC 540 to the processing/control unit 530 via communication bus 590.

In operation, the processing/control unit 530 may receive configuration data via communication line 550 and the processing/control unit 530 may program the programmable components 520 by sending data via communication line/bus 560. After the components 520 are programmed, they may receive data from sensors 520A-510C and these components may process received sensor signals in the analog domain and processed data may be provided back to the processing/control unit 530 via ADC 540.

Processing/control unit 530 may store the data received from ADC 540 at a non-volatile memory (e.g., a NOR FLASH memory) such that data can be provided to the computer at the top of the wellbore via communication signal line 550. Alternatively, or additionally, processing/control unit 530 may perform additional signal processing in the digital domain on the digitized data received from ADC 540. In certain instances, any data stored at memory residing at processing control unit 530 may be extracted when the bottom hole assembly is removed from the wellbore.

Components used in an apparatus of the present disclosure may be selected based on their ability to withstand high temperatures or temperatures that vary. Temperatures of a wellbore may vary from sub-room temperatures to temperatures that approach or exceed 200 degrees Celsius (C.). These temperatures mean that some components may not be suitable for the wellbore environment. For example, in an instance when NAND FLASH memory either cannot operate or is judged to be unreliable at temperatures that approach 200 C, NAND FLASH memory may not be used. Instead, when NOR FLASH memory can work reliably at these temperatures, NOR FLASH memory may be used. Because of this, memory that is used to store digitized data at processing control unit 530 may use NOR FLASH memory. This is true even though NAND FLASH tends to be much less dense than NOR FLASH memory.

Components included in the set of programmable components may include op-amps, resistors, capacitors, and/or switching components. Resistors and capacitors may have fixed values or may be implemented using memristors and/or memcapacitors, other components, or a combination of these types of components.

The programmable components 520 may also include or be implemented using memcomputing devices that may be configured to perform mathematical functions. Memcomputing devices may perform mathematical functions associated with matrix multiplication, matrix addition, with partial derivative equations, or other mathematical functions. Methods of the present disclosure may solve issues with memcomputing devices applied to certain mathematical functions as conventional memcomputing devices require a fixed set of hardware to perform a given function. Methods of the present disclosure may, therefore, improve utility of memcomputing devices.

Figure 6A:
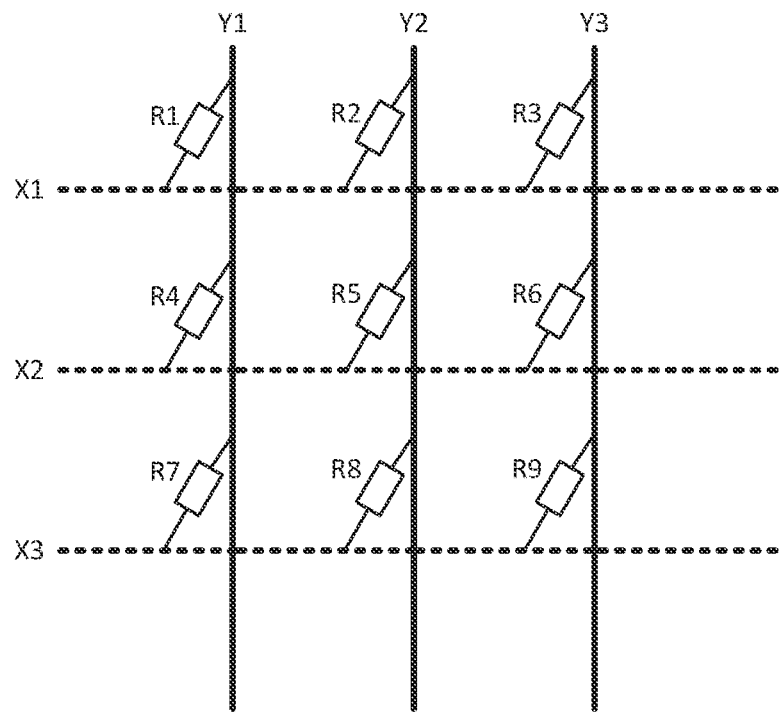
FIG. 6A illustrates an array of memristors that may each be set at particular values by applying appropriate voltages on or currents to different set of wires.

FIG. 6A illustrates an array of memristors that may each be set at particular values by applying appropriate voltages on or currents to different sets of wires. FIG. 6A includes wires Y1, Y2, and Y3 that run vertically up and down (e.g., columns), wires X1, X2, and X3 that run left to right (e.g., rows), and memristors R1 through R9 (R1, R2, R3, R4, R5, R6, R7, R8, and R9). Each of these sets of wires is connected to memristors in a crossbar configuration. Memristor values may be set using voltages or currents that are sufficient to create a phase change in certain types of materials. In respect to FIG. 6A, voltages applied between a specific vertical wire and a specific horizontal wire may be used to set the resistance of specific resistors. For example, a voltage applied between wire Y1 and wire X1 can be used to program a value of resistance for resistor R1. Similarly, a voltage applied between wire Y2 and wire X3 can be used to program a value of resistance for resistor R8.

Once resistance values are set, a summing operation may be performed by providing input voltages on specific rows and measuring output currents on a specific column. Arrays of memristors may also be used to perform multiplication functions by configuring multiple resistors in a parallel configuration, providing an input voltage, and measuring a resulting current. Currents may be identified by measuring a voltage dropped across a resistance and by using Ohms law to calculate the current: voltage=current*resistance V=IR and V/R=I. Operations of partial differential equations may be computed using multiplications and additions associated with resistance values of programmed memristors. Memristor arrays may be used in combination with op-amps to perform various different mathematical operations in the analog domain.

While the array of FIG. 6A includes memristors, similar arrays may be used to connect other components. For example, other arrays could include op-amps, fixed value resistors, fixed value capacitors, and/or other components. An integrated circuit, multichip module, or electronic assembly could include different arrays of different components that can be coupled together using links or switches. Dynamic computing random access memory using memcapacitors may also be used to compute and store data.

Figure 6B:
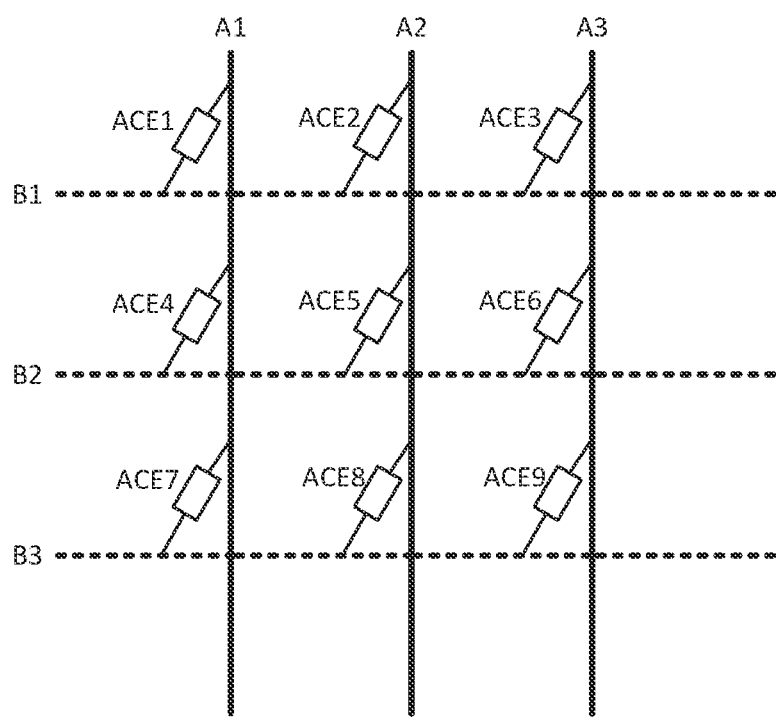
FIG. 6B illustrates a set of configurable analog devices where each of the devices of FIG. 6B may include one or more operational amplifiers.

FIG. 6B illustrates a set of configurable analog devices where each of the devices of FIG. 6B may include one or more operational amplifiers. Each of the devices in FIG. 6B may be referred to as analog configurable unit (ACU) or an analog configurable element (ACE). FIG. 6B includes wires A1, A2, and A3 that run vertically up and down (e.g., columns), wires B1, B2, and B3 that run left to right (e.g., rows), and analog configurable elements (ACEs) ACE1 through ACE9 (ACE1, ACE2, ACE3, ACE4, ACE5, ACE6, ACE7, ACE8, and ACE9). Each of these sets of wires are connected to a respective ACE in a crossbar configuration.

Other components such as memristors set at a particular value or discrete components may be attached to respective inputs of an ACE when an array of ACEs is programmed to perform a particular mathematical function. Element ACE1 may be an op-amp that has an output connected to wire A1 and may include an input connected to wire B1. In certain instances, components R1-R9 of FIG. 6A may be attached to inputs or outputs of specific operational amplifiers when any of the circuits of FIGS. 2-4 are configured. In such instances, specific values or resistors, capacitors, or other components may be used to form an integrator, an amplifier, a summer, a differentiator, or a circuit that includes each of these or one or more of integrators, amplifiers, the summers, or differentiators.

In certain instances, one or more ACEs may have components of known value that are permanently connected to an input or an output of an operational amplifier. For example, the inverting integrator 210 of FIG. 2 may have one end of resistor R1 permanently connected to the inverting input of the operational amplifier of inverting integrator 210. Furthermore, capacitor C1 may have one end connected to an inverting input and another end connected to an output of inverting integrator 210. In such an instance, values of R1 and C1 for a first ACE may also be set permanently. This means that some components of some ACEs may be permanently configured, and other components may be flexibly configured.

Alternatively, or additionally, components permanently attached to particular inputs or outputs of an ACE may be configurable. For example, memristors used to form an inverting amplifier may be connected to programming circuits used to set a value of resistance for a resistor that is permanently connected to an input and/or output of an operational amplifier as discussed in respect to FIG. 8.

As noted above, environmental conditions within a wellbore include high temperatures and temperature changes, among others. A phenomenon referred to as "Johnson noise" is where an amount of electrical noise generated by electrical components tends to increase with temperature. As temperature increases, an amount of noise generated within or by a component may increase in a non-linear way. This is because Johnson noise is a function of vibrations in the structure of a component that increase with temperature. Compensating for variations of noise can be problematic in environments like a wellbore. Analog components may be more sensitive to Johnson noise than digital components because digital components are typically not sensitive to noise that is outside a frequency band that the digital components use. Since analog components essentially have infinite resolution, a quantity of noise at any frequency may interfere with the performance of these analog components. Regarding resistors, a higher value resistor will generate more Johnson noise than lower value resistors.

A change in temperature also can result in a change in an offset or bias voltage and in a change in gain of an amplifier. This means that there are at least three factors that affect the operation of analog components as temperatures change. This means that operational characteristics of a set of analog components performing mathematical functions will vary with temperature. While one could attempt to compensate for such variations using equations, such solutions would further reduce the efficiency of a system to perform processing tasks. Because of this, it would be beneficial to compensate for temperature variations in ways that do not require real-time or near-real-time processing.

One way to compensate for changing temperatures is to characterize a specific set of circuits to identify how noise, bias offsets, and gain change at specific temperatures. Once these factors are known, they may be stored in a lookup table. For example, values of noise, bias, and gain may be identified for temperatures or temperature changes between 0 degrees C. and 200 degrees C., and these values may be stored in the lookup table. Compensations to calculations performed by the set of analog circuits may then be looked up in order to normalize results of the calculations (e.g., adjust for errors caused by changes in noise, bias, and gain). In certain instances, a bias or offset associated with a temperature may be compensated for by changing an input bias voltage, such as the voltage A of FIG. 4. Alternatively, or additionally, compensations may be made in by a set of digital electronics. For example, a processor that receives the result of a differential equation from an analog component after being sampled by a ADC may access a lookup table and temperature data to identify that a voltage value associated with the sampled result and apply an offset to that sampled result to compensate for a known temperature related bias or gain offset.

Circuitry used in wellbore operations may be built as one or more sets of multichip modules, as a system on a chip (e.g., one or more integrated circuits). Such devices may include multiple chips mounted on a substrate. Layers of these module chips, integrated circuits, and/or substrates may include one or more highly insulating layers to reduce amounts of noise that propagate through the circuitry. Such highly insulating layers may include or be made of "silicon on oxide" or "silicon on sapphire." Other ways noise propagation may be reduced include isolating digital circuits from analog circuits and/or tying digital grounds to analog grounds together only at one point.

Other methods that may be used to mitigate noise, bias offsets, or gain changes include auto zeroing techniques, using low value resistors, using low drift components, and circuit configurations that are resistant to drift.

Yet another technique that may be used to reduce effects of temperature variation and high temperatures include the use of a chilling device. For example, a Peltier cooler, a Sterling cryocooler or a Joule Thomson cryogenic mini cooler may be used to cool an electronic assembly.

Figure 7:
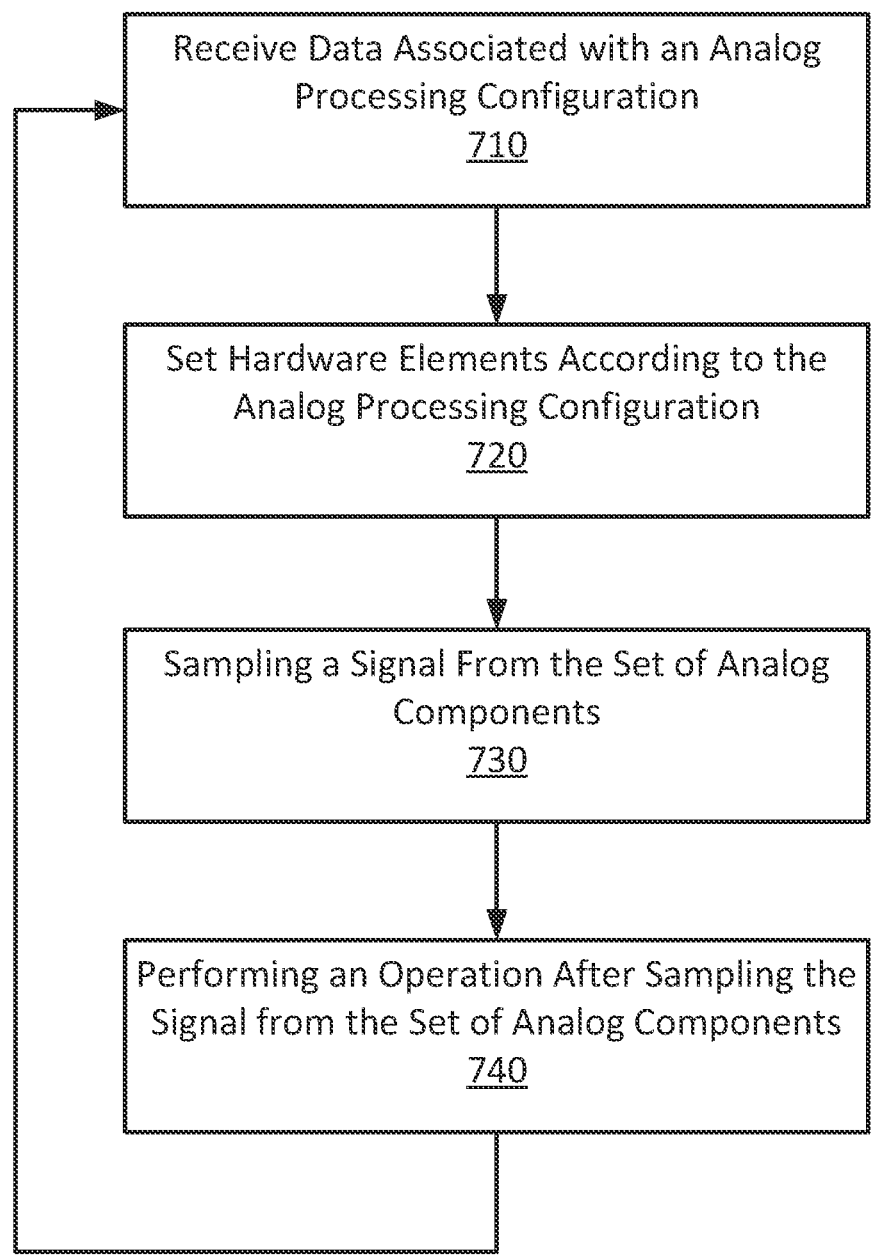
FIG. 7 illustrates a series of steps where a set of analog processing components are configured and where the set of processing components performs a processing function in the analog domain based on the receipt of a set of analog processing configuration data.

FIG. 7 illustrates an example process for configuring a set of analog processing components and using the set of processing components to perform a processing function in the analog domain based on the receipt of a set of analog processing configuration data. FIG. 7 begins with step 710 where a set of data that identifies an analog processing configuration is received. The data received in step 710 may be received by a digital computing device or a set of digital processing logic. In step 720, a set of analog components may be configured according to the set of analog processing confirmation data. Step 710 and step 720 may be performed by the electronics of the processing control unit 530 of FIG. 5 when a processing configuration is programmed at the set of programmable components 520 of FIG. 5.

After step 720, a signal from the set of analog components may be sampled in step 730. This may include sampling signals on lines 580A and 580B by ADC 540 of FIG. 5. Here again, the signals on lines 580A and 580B may have been generated based on information sensed by sensors, such as sensors 510A-510C of FIG. 5. Next in step 740, an operation may be performed after the sampling of the signal from the set of analog components. After step 740, a new set of data associated with the analog processing configuration may be received in step 710.

An analog processing function performed by the analog components may correspond to any mathematical operation capable of being performed by the set of analog components used in a particular assembly. For example, an analog processing function can include additions, multiplications, solving a partial differential equation, and/or performing a set of mathematical operations in parallel. Result signals of such functions may be provided to one or more analog to digital converters that is/are used when other operations are performed. Operations performed in step 740 may include storing sampled data, digital filtering, performing temperature compensation functions (e.g., changing bias levels or making adjustments based on noise or amplification changes associated with a temperature).

Figure 8:
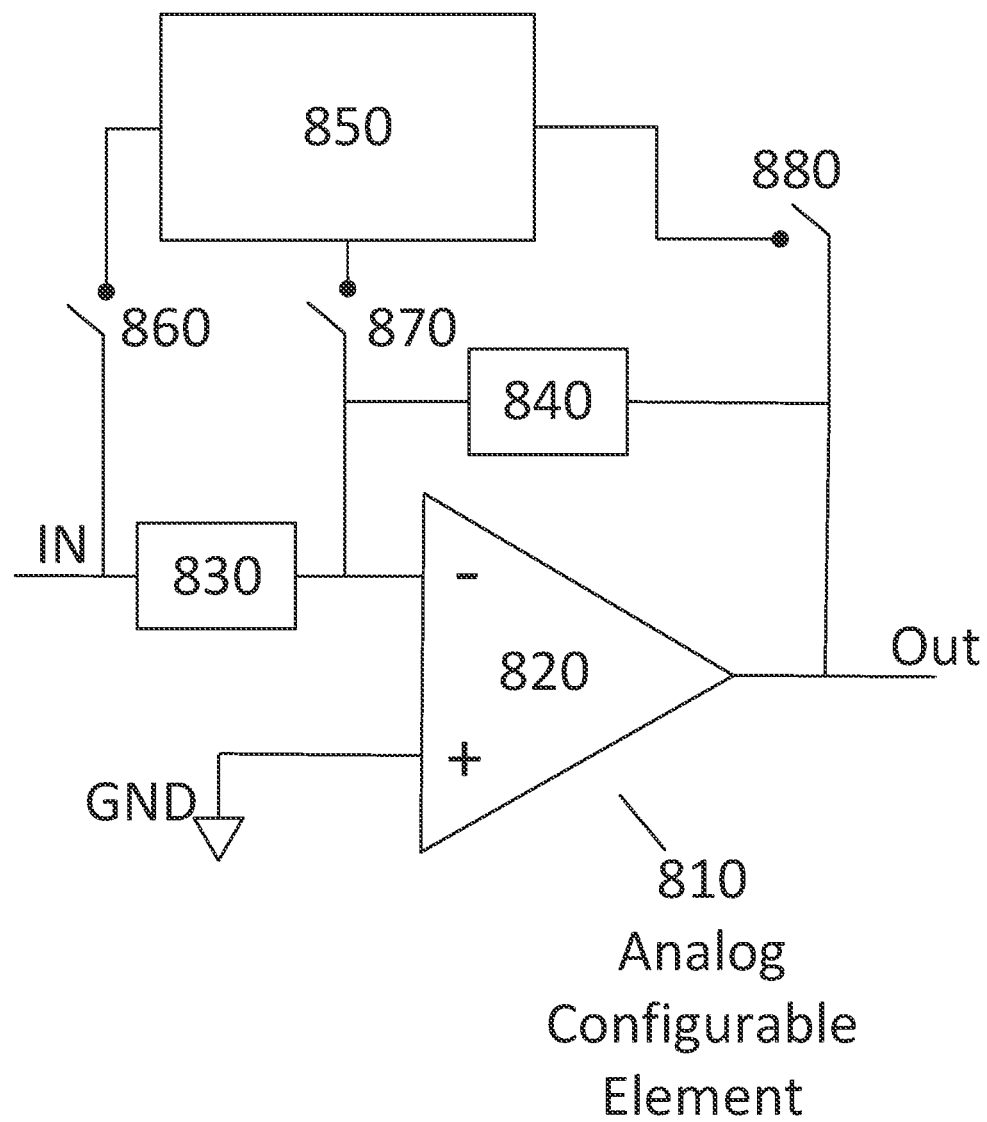
FIG. 8 illustrates an analog configurable element with components that are connected to inputs and/or outputs of an operational amplifier.

FIG. 8 illustrates an analog configurable element with components that are connected to inputs and/or outputs of an operational amplifier. FIG. 8 includes operational amplifier 820, components 830 and 840, configuration circuit 850, and switches 860, 870, and 880. Components 830 and 840 may be, for example, memristors or memcapacitors that may be configured with capacitance or resistance values set by configuration circuit 850. Switches 860 and 870 may be closed and a stimulation (e.g., a voltage or current) may be applied to component 830 that sets the value of component 830. This may include closing switches 860 and 870 while leaving switch 880 open when a value of component 830 is set.

Similarly, switches 870 and 880 may be closed and component 840 may be configured by applying a stimulus to component 840. This may include closing switches 860 and 870 while leaving switch 880 open when a value of component 830 is set. This may also include closing switches 870 and 880 while leaving switch 860 open when a value of component 840 is set. Types of devices that components 830 and 840 may be include memristors, memcapacitors, or other types of components.

Analog configurable element 810 may include traces that are shorter when configuration switches 860, 870, and 880 are open than when these switches are closed. The input IN and the output Out of the analog configurable element 810 of FIG. 8 may be connected to switches not illustrated in FIG. 8 and such switches may be closed when a circuit that includes many operational amplifiers are configured. FIG. 8 also shows that a non-inverting input of operational amplifier 810 it connected to ground (GND).

Figure 9:
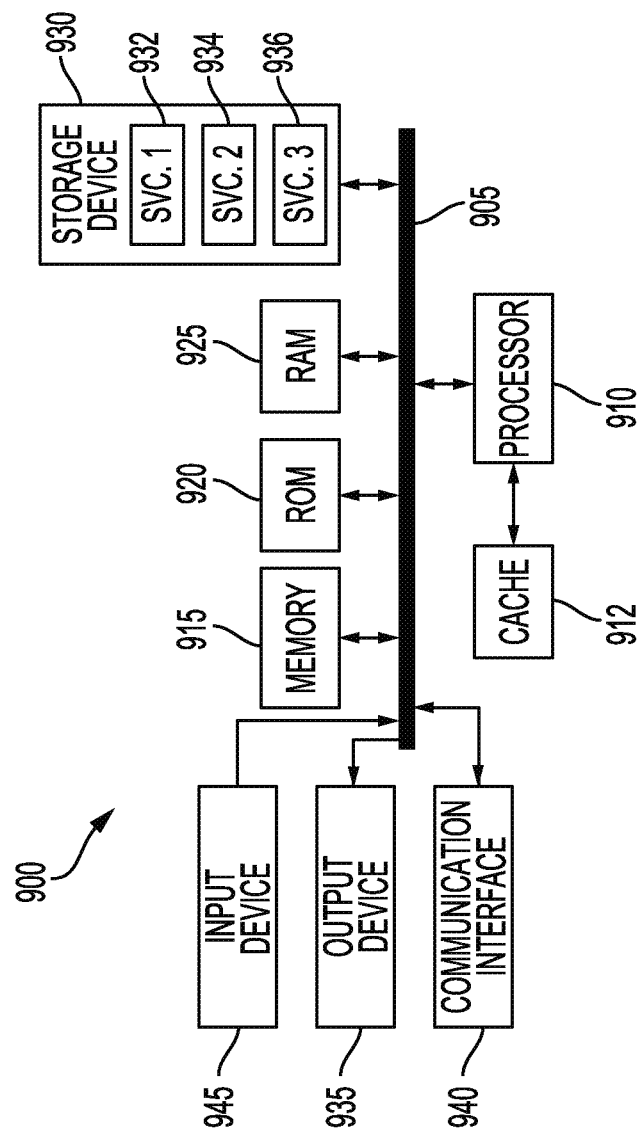
FIG. 9 illustrates an example computing device architecture which can be employed to perform various steps, methods, and techniques disclosed herein.

FIG. 9 illustrates an example computing device architecture 900 which can be employed to perform various steps, methods, and techniques disclosed herein. Specifically, the computing device architecture can be integrated with the electromagnetic imager tools described herein. Further, the computing device can be configured to implement the techniques of controlling borehole image blending through machine learning described herein.

As noted above, FIG. 9 illustrates an example computing device architecture 900 of a computing device which can implement the various technologies and techniques described herein. The components of the computing device architecture 900 are shown in electrical communication with each other using a connection 905, such as a bus. The example computing device architecture 900 includes a processing unit (CPU or processor) 910 and a computing device connection 905 that couples various computing device components including the computing device memory 915, such as read only memory (ROM) 920 and random-access memory (RAM) 925, to the processor 910.

The computing device architecture 900 can include a cache of high-speed memory connected directly with, in close proximity to, or integrated as part of the processor 910. The computing device architecture 900 can copy data from the memory 915 and/or the storage device 930 to the cache 912 for quick access by the processor 910. In this way, the cache can provide a performance boost that avoids processor 910 delays while waiting for data. These and other modules can control or be configured to control the processor 910 to perform various actions. Other computing device memory 915 may be available for use as well. The memory 915 can include multiple different types of memory with different performance characteristics. The processor 910 can include any general purpose processor and a hardware or software service, such as service 1 932, service 2 934, and service 3 936 stored in storage device 930, configured to control the processor 910 as well as a special-purpose processor where software instructions are incorporated into the processor design. The processor 910 may be a self-contained system, containing multiple cores or processors, a bus, memory controller, cache, etc. A multi-core processor may be symmetric or asymmetric.

To enable user interaction with the computing device architecture 900, an input device 945 can represent any number of input mechanisms, such as a microphone for speech, a touch-sensitive screen for gesture or graphical input, keyboard, mouse, motion input, speech and so forth. An output device 935 can also be one or more of a number of output mechanisms known to those of skill in the art, such as a display, projector, television, speaker device, etc. In some instances, multimodal computing devices can enable a user to provide multiple types of input to communicate with the computing device architecture 900. The communications interface 940 can generally govern and manage the user input and computing device output. There is no restriction on operating on any particular hardware arrangement and therefore the basic features here may easily be substituted for improved hardware or firmware arrangements as they are developed.

Storage device 930 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 925, read only memory (ROM) 920, and hybrids thereof. The storage device 930 can include services 932, 934, 936 for controlling the processor 910. Other hardware or software modules are contemplated. The storage device 930 can be connected to the computing device connection 905. In one aspect, a hardware module that performs a particular function can include the software component stored in a computer-readable medium in connection with the necessary hardware components, such as the processor 910, connection 905, output device 935, and so forth, to carry out the function.

Aspects of the disclosure may include:

Aspect 1 may be an apparatus that includes a set of components; a set of configurable switch elements that make connections to at least a subset of the set of components via controlled programming of the set of configurable switch elements; a first input that receives a first set of configuration information, wherein the set of configurable switch elements are programmed to perform a function in the analog domain based on the receipt of first set of configuration information via the first input; and a second input that receives a sensor signal, wherein the function is performed in the analog domain based on receipt of the sensor signal to generate a second signal.

Aspect 2 may include the elements of Aspect 1, further comprising an analog to digital converter (ADC) that converts the second signal into a set of bits.

Aspect 3 may include Aspect 2, where wherein the set of bits are provided to a computing device for processing in the digital domain.

Aspect 4 may include any of Aspects 2 through 3, further comprising a set of digital electronics that receives the set of bits and that performs a function based on receipt of the set of bits.

Aspect 5 may include Aspect 2, where the set of components includes analog components.

Aspect 6 may include Aspect 2, where the set of components includes digital components.

Aspect 7 may include any of Aspects 1 through 6, further comprising a data storage that stores a lookup table with information associated with compensating for temperature.

Aspect 8 may include any of Aspects 1 through 7, further comprising a control computer, wherein the set of digital electronics receives the first set of configuration information via the first input from the control computer, and provides data associated with the set of bits to the control computer.

Aspect 9 may include any of Aspects 1 through 8, further comprising a memory; and a processor that executes instructions out of the memory to perform a function based on receiving the set of bits.

Aspect 10 may include any of Aspects 2 through 9, wherein the set of components, the set of configurable switch elements, and the ADC are located in a wellbore and a value associated with the set of bits is adjusted based on a condition associated with the wellbore.

Aspect 11 may be a method comprising setting a configuration of a set of configurable switch elements and analog components according to a set of received data; receiving an analog signal from a sensor; performing a computation in the analog domain based on the configuration of the configurable switch elements and the analog components, the computation performed in the analog domain on the analog signal received from the sensor; and generating a second signal that corresponds to the computation in the analog domain.

Aspect 12, the method of Aspect 11, further comprising converting the second signal to the digital domain by sampling the second signal by an analog to digital converter (ADC) that converts the second signal into a set of bits.

Aspect 13, the method of Aspect 12, further comprising providing the set of bits to a computing device for processing in the digital domain.

Aspect 14, the method of any of Aspects 12 through 13, further comprising performing a processing function by a set of digital electronics that receives the set of bits.

Aspect 15, the method of any of Aspects 12 through 14, further comprising accessing a data storage that stores lookup table information associated with compensating for temperature related changes.

Aspect 16, the method of Aspect 15, further comprising making an adjustment based on the lookup table information accessed at the data storage.

Aspect 17, the method of Aspect 15, wherein the adjustment compensates for at least one of a bias, Johnson noise, or a gain that varies with temperature.

Aspect 18, the method of any of Aspects 11 through 17, further comprising setting a second configuration of a set of configurable switch elements and analog components according to a second set of received data; receiving an additional analog signal from the sensor; performing a second computation in the analog domain based on the second configuration of the configurable switch elements and analog components, the second computation performed in the analog domain on the additional analog signal received from the sensor; and generating a third signal that corresponds to the second computation in the analog domain.

Aspect 19, the method of any of Aspects 12 through 18, further comprising providing data associated with the set of bits to a control computer.

Aspect 20, the method of any of Aspects 12 through 19, further comprising adjusting a value associated with the set of bits based on a condition associated with a wellbore when the set of configurable switch elements and the ADC are located in the wellbore.

Aspect 21, comprising a system comprising means for performing a method according to any of Aspects 11 through 20.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random-access memory (RAM) such as synchronous dynamic random-access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool. Additionally, the illustrate embodiments are illustrated such that the orientation is such that the right-hand side is downhole compared to the left-hand side.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or another word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. An apparatus comprising:
   a set of components;
   a set of configurable switch elements that make connections to at least a subset of the set of components via controlled programming of the set of configurable switch elements;
   a first input that receives a first set of configuration information, wherein the set of configurable switch elements are programmed to perform a function in an analog domain based on a receipt of the first set of configuration information via the first input; and a second input that receives a sensor signal, wherein the function is performed in the analog domain based on receipt of the sensor signal to generate a second signal.

2. The apparatus of claim 1, further comprising:
an analog to digital converter (ADC) that converts the second signal into a set of bits.

3. The apparatus of claim 2, wherein the set of bits is provided to a computing device for processing in a digital domain.

4. The apparatus of claim 2, further comprising:
a set of digital electronics that receives the set of bits and performs an additional function based on receipt of the set of bits.

5. The apparatus of claim 2, wherein the set of components includes analog components.

6. The apparatus of claim 5, wherein the set of components includes digital components.

7. The apparatus of claim 4, further comprising a data storage that stores a lookup table with information associated with compensating for temperature.

8. The apparatus of claim 4, further comprising:
a control computer, wherein the set of digital electronics:
receives the first set of configuration information via the first input from the control computer, and
provides data associated with the set of bits to the control computer.

9. The apparatus of claim 2, further comprising:
a memory; and
a processor that executes instructions out of the memory to perform a function based on receiving the set of bits.

10. The apparatus of claim 2, wherein:
the set of components, the set of configurable switch elements, and the ADC are located in a wellbore and a value associated with the set of bits is adjusted based on a condition associated with the wellbore.

11. A method comprising:
setting a configuration of a set of configurable switch elements and analog components according to a set of received data;
receiving an analog signal from a sensor;
performing a computation in the analog domain based on the configuration of the configurable switch elements and the analog components, the computation performed in the analog domain on the analog signal received from the sensor; and
generating a second signal that corresponds to the computation in the analog domain.

12. The method of claim 11, further comprising converting the second signal to the digital domain by sampling the second signal by an analog to digital converter (ADC) that converts the second signal into a set of bits.

13. The method of claim 12, further comprising providing the set of bits to a computing device for processing in the digital domain.

14. The method of claim 12, further comprising:
performing a processing function by a set of digital electronics that receives the set of bits.

15. The method of claim 14, further comprising accessing a data storage that stores lookup table information associated with compensating for temperature related changes.

16. The method of claim 15, further comprising making an adjustment based on the lookup table information accessed at the data storage.

17. The method of claim 16, wherein the adjustment compensates for at least one of a bias, Johnson noise, or a gain that varies with temperature.

18. The method of claim 11, further comprising:
setting a second configuration of a set of configurable switch elements and analog components according to a second set of received data;
receiving an additional analog signal from the sensor;
performing a second computation in the analog domain based on the second configuration of the configurable switch elements and analog components, the second computation performed in the analog domain on the additional analog signal received from the sensor; and
generating a third signal that corresponds to the second computation in the analog domain.

19. The further comprising of claim 12, further comprising:
providing data associated with the set of bits to a control computer.

20. The method of claim 12, further comprising:
adjusting a value associated with the set of bits based on a condition associated with a wellbore when the set of configurable switch elements and the ADC are located in the wellbore.

* * * * *